(12) United States Patent
Guering et al.

(10) Patent No.: US 9,693,474 B2
(45) Date of Patent: Jun. 27, 2017

(54) AIRCRAFT ELECTRICAL CORE

(71) Applicant: AIRBUS OPERATIONS S.A.S., Toulouse (FR)

(72) Inventors: Bernard Guering, Montrabe (FR); Yves Durand, Aussonne (FR)

(73) Assignee: AIRBUS OPERATIONS SAS, Toulouse (FR)

( * ) Notice: Subject to any disclaimer, the term of this patent is extended or adjusted under 35 U.S.C. 154(b) by 407 days.

(21) Appl. No.: 14/227,265

(22) Filed: Mar. 27, 2014

(65) Prior Publication Data

US 2014/0209742 A1    Jul. 31, 2014

Related U.S. Application Data

(63) Continuation of application No. PCT/FR2012/052138, filed on Sep. 25, 2012.

(30) Foreign Application Priority Data

Sep. 30, 2011 (FR) ..................................... 11 58829

(51) Int. Cl.
  *H05K 7/02* (2006.01)
  *H05K 7/14* (2006.01)
  *B64D 47/00* (2006.01)

(52) U.S. Cl.
  CPC ............... *H05K 7/02* (2013.01); *B64D 47/00* (2013.01); *H05K 7/1439* (2013.01); *H05K 7/1449* (2013.01)

(58) Field of Classification Search
  CPC ........... H05K 7/02; H05K 7/14; H05K 7/1449
  See application file for complete search history.

(56) References Cited

U.S. PATENT DOCUMENTS

| | | | | |
|---|---|---|---|---|
| 6,140,586 A | * | 10/2000 | Imani | H02G 3/0481 174/72 C |
| 7,547,845 B2 | * | 6/2009 | Azemard | H05K 7/1449 174/480 |
| 8,559,149 B2 | | 10/2013 | Wavering et al. | |
| 2003/0042990 A1 | * | 3/2003 | Schumacher | H05K 9/0062 333/12 |
| 2007/0164152 A1 | * | 7/2007 | Anderson | B64C 1/10 244/118.1 |
| 2011/0127379 A1 | | 6/2011 | Jager et al. | |
| 2011/0194269 A1 | | 8/2011 | Colongo et al. | |

FOREIGN PATENT DOCUMENTS

WO    2006010840 A1    2/2006

OTHER PUBLICATIONS

International Searching Authority, International Search Report for PCT/FR2012/052138 Mailed Jan. 28, 2014.

* cited by examiner

*Primary Examiner* — Christopher P Ellis
*Assistant Examiner* — Jessica Wong
(74) *Attorney, Agent, or Firm* — Lorenz & Kopf, LLC

(57) ABSTRACT

An electrical core of an aircraft is provided. The electrical core includes at least one shelf on which is disposed at least one module containing components and comprising at least one input able to be linked to at least one power supply cable and at least one output able to be linked to at least one output cable. In the module, the output cable or cables travel under or in the shelf disposed under the module.

15 Claims, 5 Drawing Sheets

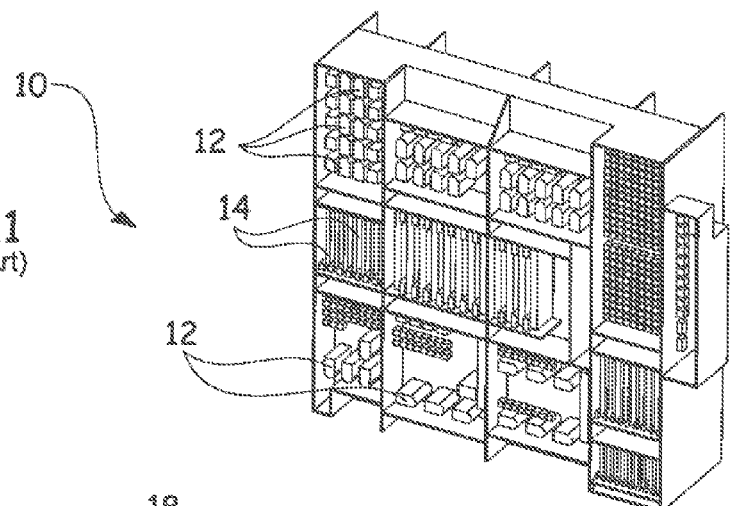
FIG.1 (Prior Art)
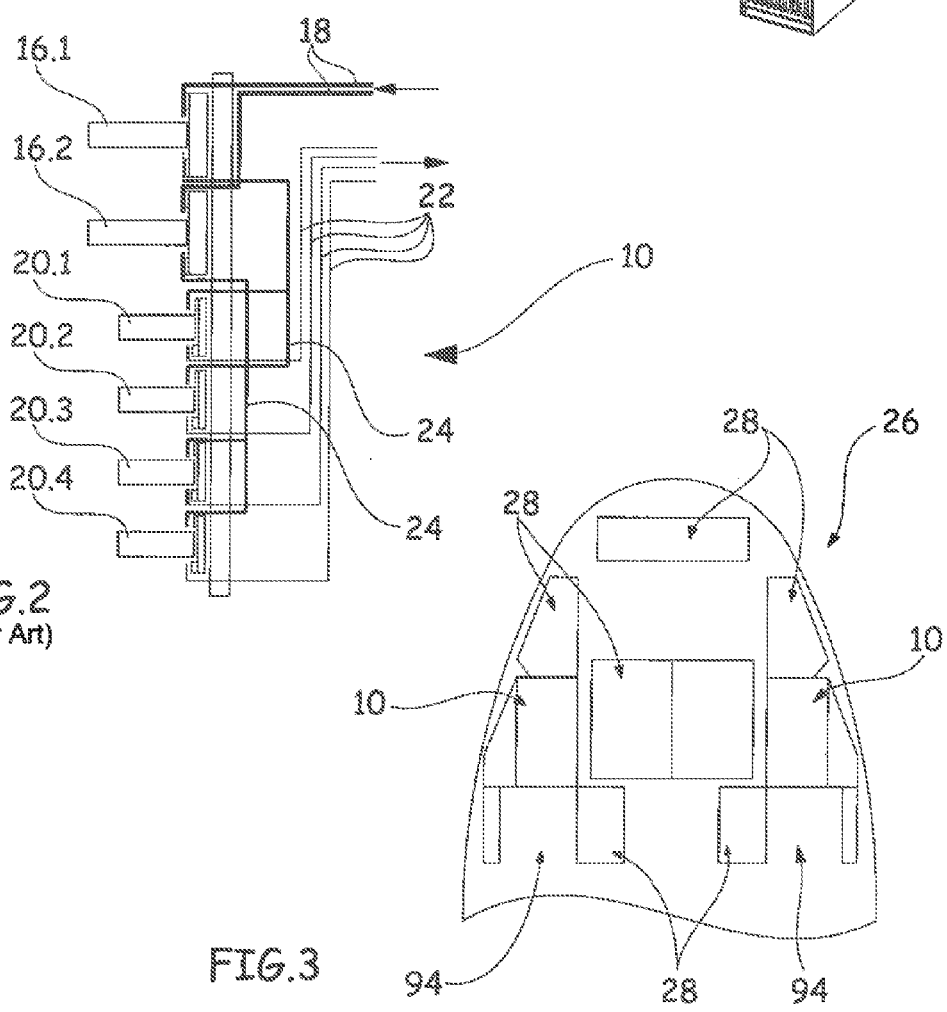
FIG.2 (Prior Art)
FIG.3

AIRCRAFT ELECTRICAL CORE

CROSS-REFERENCE TO RELATED APPLICATIONS

This is a continuation of International Application No. PCT/FR2012/052138, filed Sep. 25, 2012, which application claims priority to French Application No. 11 58829, filed Sep. 30, 2011, which are each incorporated herein by reference in their entirety.

TECHNICAL FIELD

The technical field pertains to an aircraft electrical core.

BACKGROUND

An electrical core is a cupboard which manages and distributes the electrical energy aboard the aircraft which originates mainly from the generators present on the engines, from an auxiliary power generator or from other sources via generating cables.

As illustrated in FIG. 1, an electrical core 10 comprises components 12 such as contactors, relays, circuit breakers, or others as well as electronic boards 14. These numerous components are inter-linked electrically and are grouped together by function.

To simplify the explanations, in FIG. 2, two generating components 16.1 and 16.2 have been represented, each comprising an input linked to a generating cable 18 and several power distribution components 20.1 to 20.4 whose outputs are linked via power cables 22 to loads (not represented) distributed in the aircraft. The inputs of the power distribution components 20.1 and 20.2 are linked to the output of the generating component 16.1 by way of cables 24 or of rigid bars whilst the inputs of the power distribution components 20.3 and 20.4 are linked to the output of the generating component 16.2 by way of cables 24 or of rigid bars. These various components are disposed at the level of a vertical plane which constitutes a pane integrated into the cupboard.

The components are grouped together by modules, in particular of parallelepipedal shape, which rest on shelves. Each shelf takes the form of a hollow well whose cross-section is closed, ensuring in particular the take-up of forces and the circulation of air provided for cooling the electronics.

The electrical core of an aircraft is subjected to ever more constraining dimensional constraints, in particular for small aircraft.

Indeed, having regard to the arrangement of the components at a vertical pane parallel to the front face of the cupboard forming the electrical core and of the disposition of the front face of the cupboard parallel to the longitudinal axis of the aircraft for accessibility reasons, the electrical core occupies significant space which becomes ever more so on account of the growing electrical energy needs of new aircraft. Now, the electrical core or more precisely the electrical cores 10 of an aircraft are disposed in the nose cone 26 of the aircraft and must share the space with other systems 28 such as for example flight computers, as is illustrated in FIG. 3.

In aeronautics, there is in the avionics sector a standard "Arinc 600" which provides for connectors 30 comprising two parts, a first part 32 secured to a housing 34, such as for example a computer, and a second part 36 secured to the support 38 of the housing, as illustrated in FIG. 4. The connectors provided for the computers are of "rackable" type, namely they ensure automatic guidance and insertion of the male elements of one part of the connector into the female elements of the other part.

This type of connector disposed at the rear face of the housing comprises all the electrical cables handled by the housing, namely the cables entering and exiting, and makes it possible to assemble a large number of cables of small cross-section. This type of connector is all the more suitable as the housings take the form of electronic boards and do not comprise any cable in the housing. Consequently, the simple transposition of the connectors used for the computers according to the "Arinc 600" standard is not conceivable as things stand to an electrical core in so far as the latter comprises fewer cables with cross-sections, for some more significant, which generate more significant heating, the heating and the segregation of the cables running counter to the compactness sought in the connectors intended for computers.

Moreover, the presence of a single connector comprising the electrical inputs and outputs at the level of one of the faces of the module compels the presence of cables to ensure the electrical return to the connector, this not making it possible to optimize the density of the components over the height of the module.

According to another constraint, it is necessary to provide sufficient space at the rear of the electrical core to be able to link the generating cables 18.1 to 18.3 by way of lugs 20, as is illustrated in FIG. 5. These cables which extend from the motorizations to the electrical core have significant cross-sections having regard to the electrical powers transferred, these cross-sections being all the more significant as they are made of aluminium alloy for a weight saving. Because of their significant cross-sections and their stiffnesses, these cables need a significant radius of curvature and have difficulty running in a restricted volume.

As illustrated in FIG. 6, the generating cables 18.1 to 18.3 comprise for each phase at least two conductors, thereby tending to increase their stiffnesses.

Having regard to the stiffnesses of the cables and the lack of precision of their positionings, the segregation distance L (also called guard) between the cables is significant, thereby going counter to a run in a restricted volume.

According to another issue of concern, the floor at the rear of the electrical core 10 is not flat and follows the profile of the fuselage, thereby rendering the connection of the generating cables more difficult.

In addition, other objects, desirable features and characteristics will become apparent from the subsequent summary and detailed description, and the appended claims, taken in conjunction with the accompanying drawings and this background.

SUMMARY

Accordingly, the present disclosure is aimed at alleviating the drawbacks of the prior art by proposing an aircraft electrical core with a novel architecture making it possible to increase the density of the components per unit volume and to obtain better compactness.

For this purpose, the various teachings of the present disclosure provide an electrical core of an aircraft comprising at least one shelf on which is disposed at least one module containing components and comprising at least one input able to be linked to at least one power supply cable and at least one output able to be linked to at least one output cable, characterized in that for a module, the output cable or cables travel under or in the shelf disposed under the module.

According to one embodiment, the electrical core comprises an extension which simplifies the connection of the generating cables.

A person skilled in the art can gather other characteristics and advantages of the disclosure from the following description of exemplary embodiments that refers to the attached drawings, wherein the described exemplary embodiments should not be interpreted in a restrictive sense.

BRIEF DESCRIPTION OF THE DRAWINGS

The various embodiments will hereinafter be described in conjunction with the following drawing figures, wherein like numerals denote like elements, and wherein:

FIG. 1 is a perspective view illustrating in a schematic manner an aircraft electrical core according to the prior art;

FIG. 2 is a transverse cut illustrating in a schematic manner components of an electrical core according to the prior art;

FIG. 3 is a view from above of the nose cone of an aircraft illustrating the location of the electrical cores;

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Figure 4:
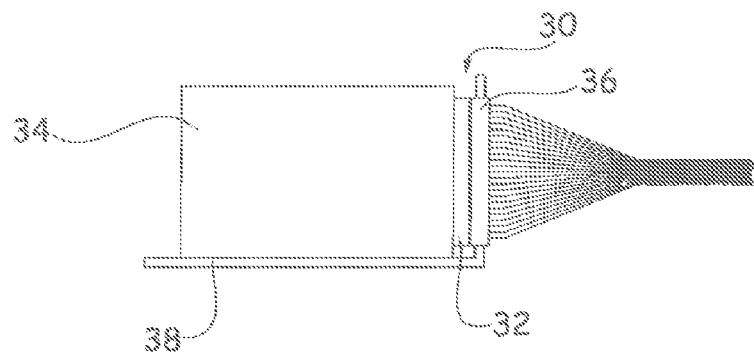
FIG. 4 is a lateral view illustrating in a schematic manner a connection used to link components of avionics systems according to the prior art.
Figure 5:
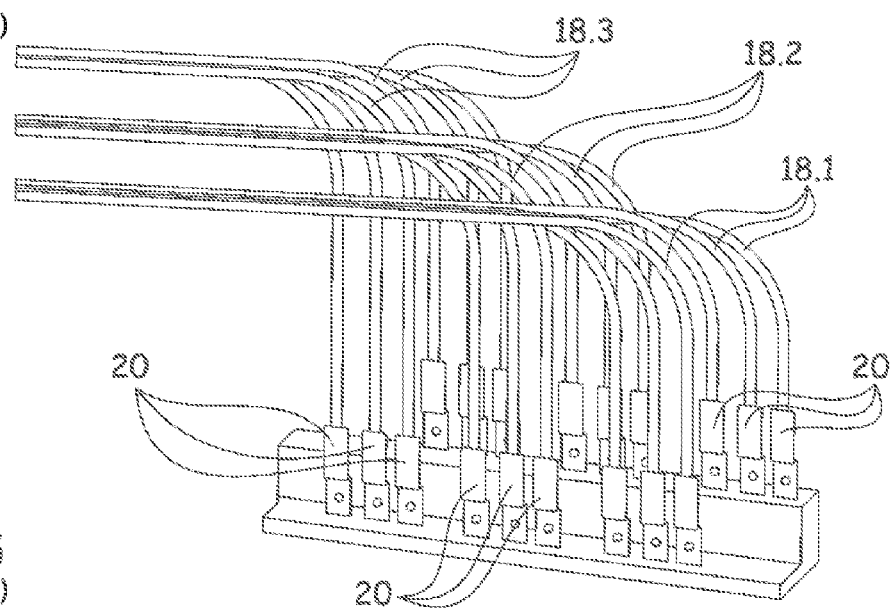
FIG. 5 is a view of a part of the rear of an electrical core according to the prior art illustrating the connection of the generating cables.
Figure 6:
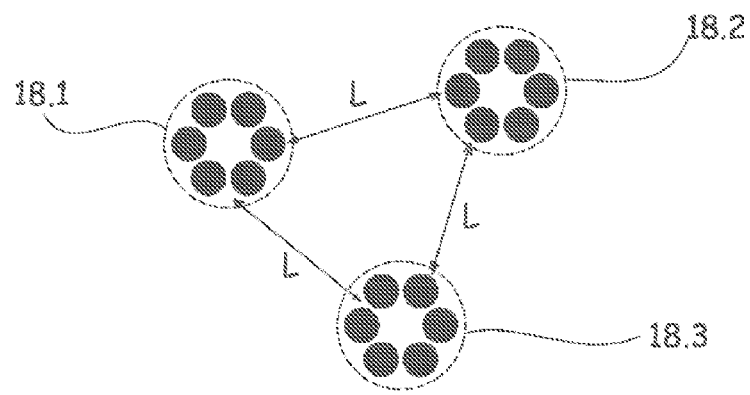
FIG. 6 is a cut illustrating the generating cables and their spacing.
Figure 7:
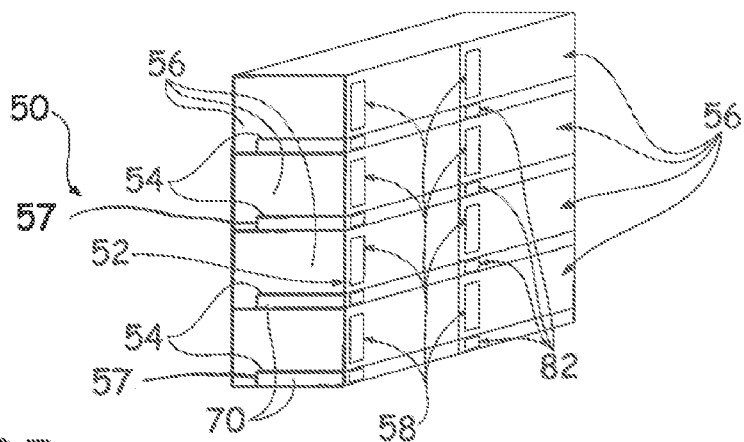
FIG. 7 is a view of the rear of an electrical core according to the various teachings of the present disclosure.
Figure 8:
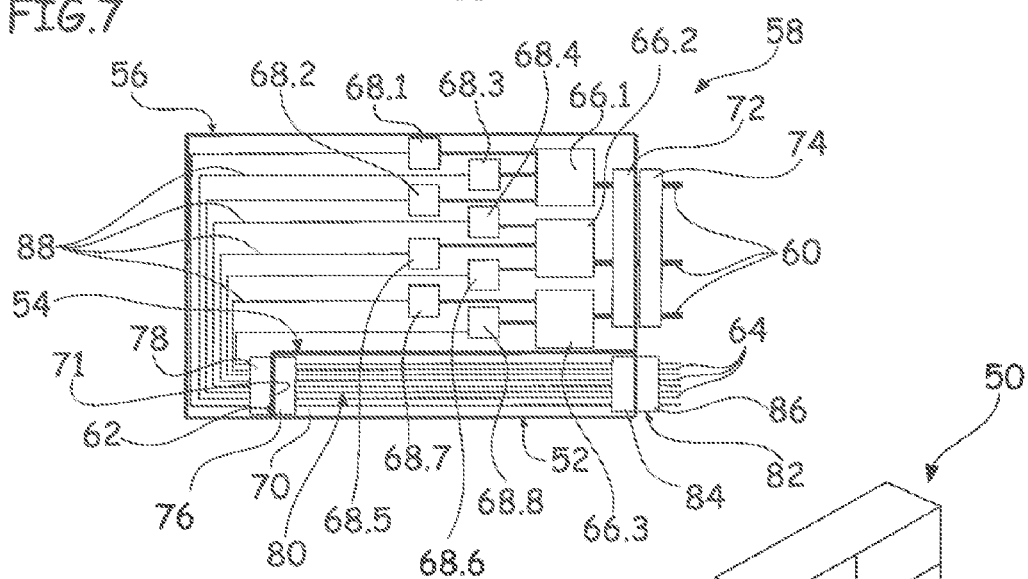
FIG. 8 is a cut of a module and of a shelf of an electrical core according to the various teachings of the present disclosure.
Figure 9:
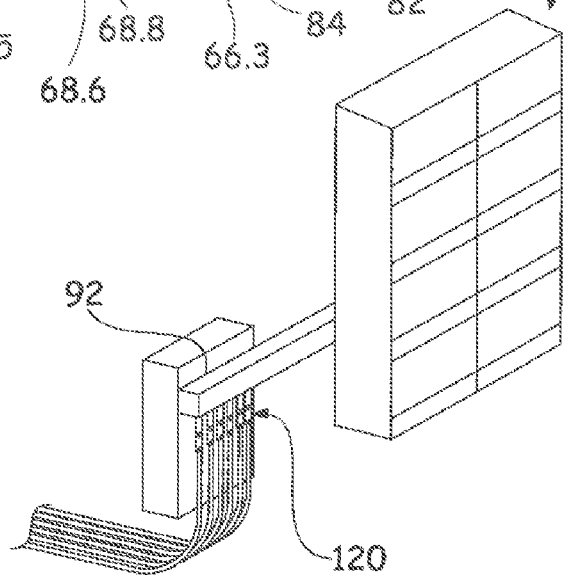
FIG. 9 is a perspective view illustrating an extension of an electrical core according to the various teachings of the present disclosure.
Figure 10:
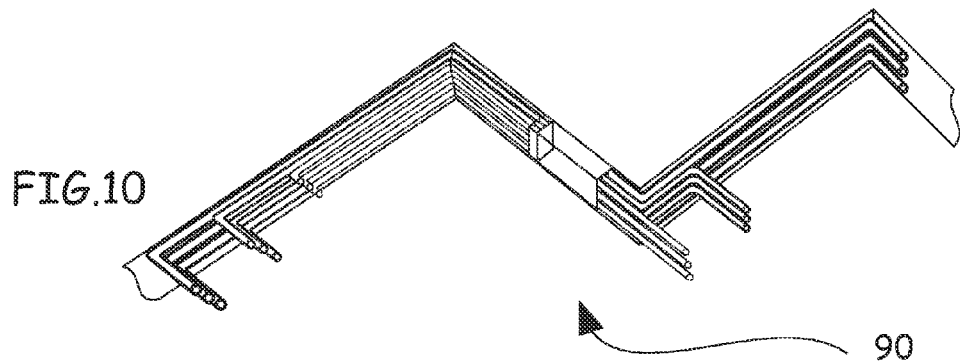
FIG. 10 is a perspective view illustrating in a schematic manner an extension of an electrical core according to the various teachings of the present disclosure.

An electrical core 50 according to the various teachings of the present disclosure has been represented in FIG. 7. The core comprises a carrier structure 52 comprising shelves 54 each supporting at least one module 56. As illustrated in FIG. 8, a module 56 comprises at least one input able to be linked by way of a first connection 58 to at least one power supply cable 60 and at least one output able to be linked by way of a second connection 62 to at least one output cable 64.

According to the example illustrated in FIG. 8, the module 56 is linked to at least one generating cable 60 and comprises outputs in the form of primary cables 64.

A module 56 groups together at least two components disposed in the direction parallel to the depth of the electrical core and traversed successively by the electric current.

Inside the modules, rigid conductors can be provided to inter-link the various components.

According to one embodiment, these components are identical to those set up on a pane of an electrical core of the prior art. Thus, the present disclosure is not aimed at modifying the components of an electrical core but their arrangements. However, the shapes and the arrangements of the components could be modified.

By way of example, in FIG. 8, a module comprises three generating components 66.1 to 66.3 each comprising an input linked to a generating cable 60 and several power distribution components 68.1 to 68.8 whose outputs are linked via power cables to loads (not represented) distributed in the aircraft. The inputs of the power distribution components 68.1 to 68.3 are linked to the output of the generating component 66.1 by way of cables or rigid bars, the inputs of the power distribution components 68.4 to 68.6 are linked to the output of the generating component 66.2 by way of cables or rigid bars, the inputs of the power distribution components 68.7 and 68.8 are linked to the output of the generating component 66.3 by way of cables or rigid bars.

Thus, in contradistinction to the prior art which makes provision to arrange them on a pane, the present disclosure proposes to incorporate the components into a volumetric structure called a module 56. Therefore, the components are also disposed according to the depth of the electrical core 50 thereby making it possible to reduce the dimensions of the front face of the electrical core for an identical number of components.

According to one embodiment of the present disclosure, the handling of the electrical function in the module 56 is carried out in direct circuit. Thus, the input of the electrical circuit via the first connection 58 is situated at the rear of the electrical core whilst the outputs via the second connection 62 are provided at the level of the front face after handling in the generating components, the components for power distribution and multiplication of the outputs.

According to a significant characteristic of the present disclosure, for at least one module 56, the output cable or cables 64 travel under or in the shelf 54 disposed under the module. This arrangement makes it possible to increase the density of the components in a module since the components can be distributed over the entire height of the module in so far as the electrical circuits do not make a loop inside the module 56.

Advantageously, the output cables 64 run in the hollow part 70 of the shelf 54 which in contradistinction to the prior art is open at the level of the front and rear faces.

According to one embodiment, the carrier structure and in one example, the shelves 54 are used to accommodate the return of the output cables to the rear face of the electrical core. According to this arrangement, the electrical core consists of a superposition of volumes, a volume dedicated to the module and a volume corresponding to the shelf. In this way, the entire height of the electrical core is used for the connection of the cables, thereby helping to increase the density of the components in the module. Moreover, this arrangement makes it possible to obtain good segregation between the generating cables and the power cables, the cables of various types being disposed at different heights.

According to one embodiment, the electrical core comprises ventilation means for cooling the cables circulating in the shelves 70.

According to one embodiment, each module 56 comprises a first substantially parallelepipedal part with a greater depth than that of the shelf and a protuberance as lower part whose height is substantially equal to that of the shelf in such a way that the module has a face 71 overlooking the lip 57 of the shelf.

To facilitate connectability, the electrical core comprises for the power supply cable or cables 60 of each module 56 a first connection 58 situated at the level of the rear face of the electrical core with a first part 72 secured to the module 56 able to cooperate with a second part 74 provided at the end of the power supply cable or cables 60 and optionally secured to the carrier structure. Advantageously, the first connection 58 is a connector of "rackable" type which ensures automatic guidance and insertion of the male elements of one part of the connector into the female elements of the other part.

As a supplement, the electrical core comprises, for each module 56, a second connection 62 for the output cable or cables 64, which is situated at the level of the face 71 of the module with a first part 76 secured to the carrier structure 52 and a second part 78 provided at the level of the module 56.

Advantageously, the second connection 62 is a connector of "rackable" type which ensures automatic guidance and insertion of the male elements of one part of the connector into the female elements of the other part.

The fact that the connections 58 and 62 are connectors of "rackable" type simplifies the mounting and the removal of the modules 56 during the manufacture of the aircraft or its maintenance.

To simplify the cabling, the carrier structure 52 can be pre-cabled and comprises, for at least one module, in the shelf 54 situated underneath, a bundle of cables 80 which extends between two parts of two connections provided at the level of the opposite lips of the shelf. Thus the output cables comprise a first segment which corresponds to the bundle of cables.

According to this embodiment, the electrical core comprises a third connection 82 situated at the level of the rear face of the electrical core, in one example, under the first connection 58.

This third connection 82 comprises a first part 84 provided at the end of the cable bundle 80 able to cooperate with a second part 86 provided at the ends of the output cable or cables 64.

The bundle of cables 80 comprises an identical, or indeed greater, number of cables than that of the cables 88 exiting the module 56.

According to one embodiment of the present disclosure, it is possible to increase the depth of the electrical core 50 and to profit from this additional depth so as to increase the density of the components in the electrical core in so far as the generating cables originating in particular from the generators of the engines are not linked directly to the rear face of the electrical core but at the level of at least one extension 90 which extends from the rear of the electrical core to a connection panel 92 offset with respect to at least one of the sides of the said electrical core. Thus, it is not necessary to provide for a significant space between the rear face of the electrical core and the wall of the fuselage to ensure the connection of the generating cables.

Advantageously, the connection panel 92 is disposed in the zone 94 corresponding to a lateral connection centre visible in FIG. 3.

This zone 94 is more accessible than the zone situated at the rear of the electrical core and offers a flat floor which improves the working conditions of the operators responsible for industrialization or maintenance.

According to the various teachings of the present disclosure, the extension comprises for each phase of each generating line a copper electrical conducting element 96.

In the subsequent description, copper is intended to mean either copper or a copper alloy.

The extension 90 constitutes an integral part of the electrical core 50. Consequently, volume saving taking priority over weight saving, it is possible to provide just a single conducting element with a significant cross-section per phase for each generating line in contradistinction to aluminium alloy generating cables which comprise at least two conducting elements with a smaller cross-section per phase so as to limit the heating of the conducting elements.

Figure 11:
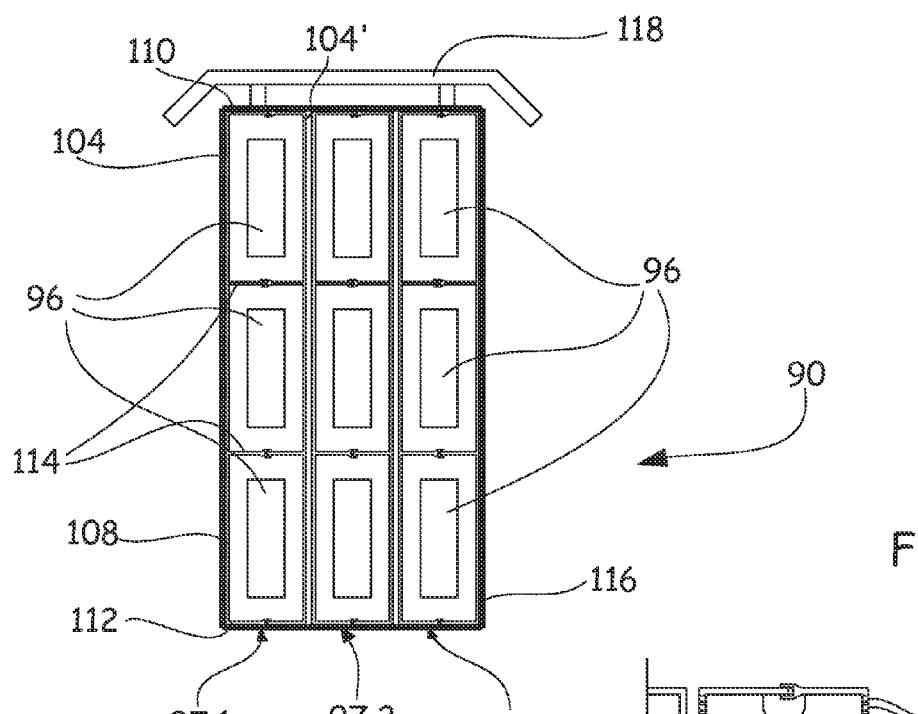
FIG. 11 is a transverse cut of an extension of an electrical core.

By way of example, nine electrical conductors, three phases for three generating lines 97.1, 97.2 and 97.3, have been represented in FIG. 11.

By using copper instead of an aluminium alloy as material, the conducting elements 96 are afforded a more significant bending ability with bending radii of the order of about 1 millimeter (mm) to about 2 mm possible.

According to another advantage, copper has a lower thermal expansion than the aluminium alloys used to make the generating cables according to the prior art.

According to one embodiment, the conducting elements 96 are rigid and each take the form of a copper rigid bar.

By providing rigid elements, the guard between each conducting element can be reduced.

According to one embodiment of the present disclosure, each conducting element 96 is disposed in a rigid conduit 98 made of an electrically insulating material, the rigid conduit 98 having a sufficient cross-section so that the conducting element is separated from the interior face of the conduit by an air gap concentric with the conducting element 96.

Figure 12:
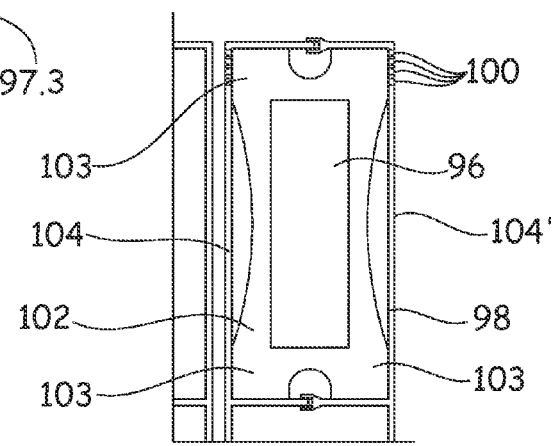
FIG. 12 is a transverse cut illustrating details of an extension of an electrical core.

This air gap also promotes the cooling of the conducting elements 96. According to a first point, in so far as each rigid conduit 98 communicates with the interior of the electrical core and that the interior of the latter is ventilated by forced ventilation, a forced air stream is produced inside each conduit 98. According to one embodiment, orifices 100 (visible in FIG. 12) are made regularly on each conduit 98 to further improve the ventilation of the conducting elements 96.

Advantageously, pads 102 are provided inside the conduit 98, distributed at regular intervals, to maintain the separation right around the conducting element 96.

According to one embodiment, these pads 102 are made of silicone. Each pad comprises a central orifice whose cross-section is tailored to that of the conducting element 96 and at the level of its periphery protuberances 103 whose exterior shapes are tailored to the cross-section of the conduit 98. Between the protuberances 103, the air can circulate along the conduit 98.

These pads 102 also ensure vibratory filtering.

According to one embodiment, the conducting elements have a rectangular cross-section and comprise an insulating surface protection. The rigid conduits 98 also have a rectangular cross-section.

Advantageously, a rigid conduit 98 consists of two assembled half-shells 104, 104'.

According to one embodiment, the half-shells are approximately symmetric in relation to a, in one example, vertical, median plane 106. Each half shell comprises a first lateral wall 108, an upper wall 110 and a lower wall 112 that are substantially perpendicular to the lateral wall 108 as well as two partitions 114 that are substantially perpendicular to the lateral wall 108 and are distributed in a regular manner between the upper 110 and lower 112 walls.

The free edges of the upper and lower walls as well as of the partitions of the half-shells have shapes which cooperate to ensure the link between the two half-shells. In one example, the two half-shells 104 and 104' are identical and assembled head-to-tail. Thus, according to one embodiment, the free edges of the upper wall and of one of the two partitions comprise slots able to receive the free edges of the other half-shell.

According to the various teachings of the present disclosure, the phases of a generating line are mutually insulated by being disposed in the conduits 98 formed by two assembled half-shells 104 and 104'. The generating lines are mutually insulated by being disposed in different suites of half-shells. Thus, for three generating lines, three suites of two half-shells are provided, a space being made between the suites of two half-shells.

The three suites of half-shells are held assembled by a holding flange 116. Thus, the extension 90 has a substantially rectangular cross-section.

In one example, a deflector 118 is provided above the set of conduits 98 to protect them from dripping liquid.

In one example, the extension 90 comprises at each end of each conducting element a differential-protection device such as for example a coil of Hall-effect type.

From the standpoint of connectability, the end of each conducting element is linked to the electrical core by a power contact, for example by a connection of large cross-section male/female "coupler" type. The other end of each conducting element is linked to the corresponding conducting element of one of the generating cables, at the level of the connection panel, by a connection of terminal strip type 120.

Even though copper has a low expansion coefficient, it is generally desirable to provide means for absorbing the length variations of the conducting elements 96.

In this sense, the means of connection between the conducting elements of the generating cables and the conducting elements of the generating lines of the extension are mounted floating on the connection panel 92.

As a variant or as a supplement, the extension 90 comprises a Z-profile along its length with about a 90° double bend so as to absorb the length variations of the conducting elements because of expansion phenomena.

Figure 13:
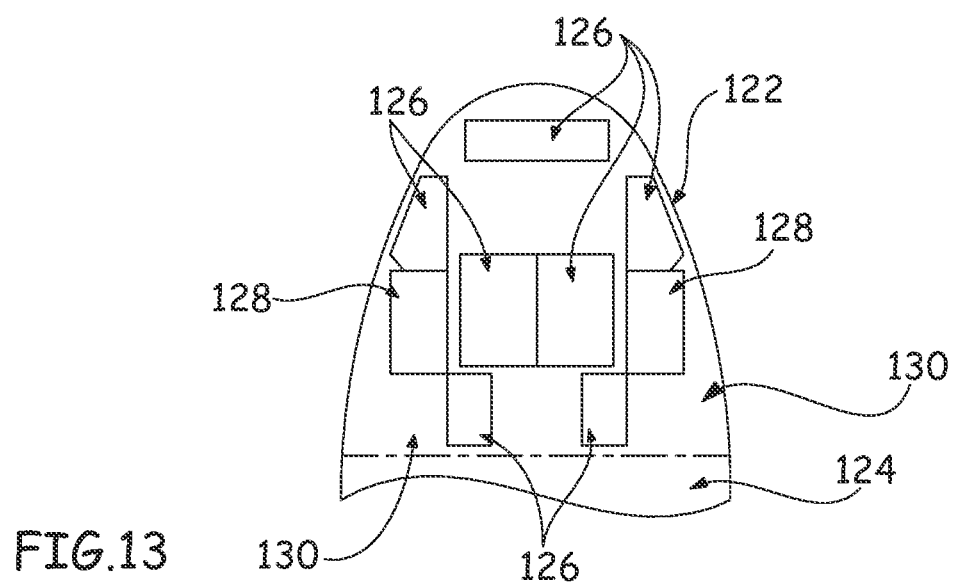
FIG. 13 is a schematic representation of an example of integration of an electrical core according to the various teachings of the present disclosure and of electrical and/or electronic cabinets in a cockpit of an aircraft.

According to the various teachings of the present disclosure, it is possible to integrate the whole of the electrical equipment customarily disposed in the bay provided under the cockpit in the volume of the cockpit by making it share the space with the other elements normally present in the said cockpit, as illustrated in FIG. 13.

Thus, in a cockpit 122 disposed in the nose of a cabin 124, it is possible to integrate electrical and/or electronic cabinets such as system cabinets 126 or electrical cores 128.

Likewise, it is possible to organize these various electrical and/or electronic cabinets so as to clear at the level of the junction between the cabin 124 and the nose cone containing the cockpit 122 at least one accessible connection centre 130, generally one on each side of the aircraft, improving the comfort of the operators responsible for the installation or the servicing of the electrical network of the aircraft.

According to this arrangement, the electrical network of the cabin is linked by virtue of connection means to the electrical network of the nose cone of the aircraft, these connection means being disposed at the level of the connection centre or centres 130. Thus, it is possible to integrate the electrical network of the cabin independently of the electrical network of the cockpit and to subsequently link them at the level of an accessible connection zone.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the present disclosure as set forth in the appended claims and their legal equivalents.

What is claimed is:

1. An electrical core of an aircraft comprising:
at least one shelf on which is disposed at least one module, the at least one module having a substantially planar face containing components and including at least one input connection on a rear face of the at least one module at a first edge of the substantially planar face, the at least one input connection being configured to be linked to at least one power supply cable,
wherein the substantially planar face of the at least one module further includes a protuberance along a second edge of the substantially planar face opposite the first edge, wherein the protuberance extends below the at least one shelf and comprises a face configured to coincide with at least one lip of the at least one shelf, and wherein the protuberance supports at least one output connection of the at least one module; and
wherein the at least one output connection is configured to be linked to at least one output cable and is situated on the face of the protuberance coinciding with the at least one lip of the at least one shelf on an opposite side of the at least one shelf from the at least one input connection,
wherein the at least one shelf has a hollow structure so that the at least one output cable travels in the hollow structure of the at least one shelf.

2. The electrical core according to claim 1, wherein the at least one input connection is configured to connect to the at least one power supply cable with a first part secured to the at least one module and is configured to cooperate with a second part provided at the end of the at least one power supply cable.

3. The electrical core according to claim 2, wherein the at least one input connection and the at least one output connection are connectors of a rackable type which ensure automatic guidance and insertion of male elements of the connectors into corresponding female elements of the cables.

4. The electrical core according to claim 1, wherein the at least one module groups together at least two components disposed in a direction parallel to a depth of the electrical core.

5. The electrical core according to claim 1, further comprising at least one extension which extends from a rear of the electrical core to a connection panel offset with respect to at least one side of the electrical core.

6. The electrical core according to claim 5, wherein the extension comprises a copper electrical conducting element for each of a plurality of phases for each of a second plurality of generating lines.

7. The electrical core according to claim 6, wherein each copper conducting element is rigid and takes the form of a bar.

8. The electrical core according to claim 6, wherein the extension comprises for each conducting element a rigid conduit made of an electrically insulating material, the rigid conduit having a sufficient cross-section so that the conducting element is separated from the interior face of the rigid conduit by an air gap concentric with the conducting element.

9. The electrical core according to claim 8, wherein the extension comprises conduit pads for maintaining the separation around the conducting element.

10. The electrical core according to claim 8, wherein the rigid conduit consists of two assembled half-shells.

11. The electrical core according to claim 5, wherein the extension comprises a Z-profile.

12. An aircraft, comprising:
   a cabin with an electrical network, and in a nose of the cabin is provided a nose cone containing an electrical network including at least one electrical cabinet,
   wherein the electrical cabinet comprises an electrical core that connects between the electrical network of the cabin and the electrical network of the nose cone, wherein the one electrical core comprises:
   at least one shelf having a lip and a hollow structure; and
   at least one module having a substantially planar face containing components and including at least one input connection on a rear face of the at least one module at a first edge of the substantially planar face, the at least one input connection being configured to be linked to at least one power supply cable,
   wherein the substantially planar face of the at least one module further includes a protuberance along a second edge of the substantially planar face opposite the first edge, wherein the protuberance extends below the at least one shelf and comprises a face configured to coincide with the at least one lip of the at least one shelf, and wherein the protuberance supports at least one output connection of the at least one module; and
   wherein the at least one output connection is configured to be linked to at least one output cable and is situated on the face of the protuberance coinciding with the at least one lip of the at least one shelf on an opposite side of the at least one shelf from the at least one input connection so that the at least one output cable travels in the hollow structure of the at least one shelf.

13. The aircraft according to claim 12, wherein the nose cone comprises a connection panel offset with respect to at least one side of the electrical core, and wherein the electrical core comprises at least one extension which extends from a rear of the electrical core to the connection panel.

14. The aircraft according to claim 13, wherein the extension comprises a copper electrical conducting element for each of a plurality of phases for each of a second plurality of generating lines.

15. The electrical core according to claim 14, wherein the extension comprises for each conducting element a rigid conduit made of an electrically insulating material, the rigid conduit having a sufficient cross-section so that the conducting element is separated from the interior face of the rigid conduit by an air gap concentric with the conducting element.

* * * * *